United States Patent
Kamepalli et al.

(12)

(10) Patent No.: US 12,001,252 B2
(45) Date of Patent: Jun. 4, 2024

(54) THERMAL AND ACOUSTICAL MANAGEMENT IN INFORMATION HANDLING SYSTEMS BASED ON MECHANICAL CONNECTIONS

(71) Applicant: DELL PRODUCTS, LP, Round Rock, TX (US)

(72) Inventors: Srinivas Kamepalli, Austin, TX (US); Travis North, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 662 days.

(21) Appl. No.: 17/148,786

(22) Filed: Jan. 14, 2021

(65) Prior Publication Data
US 2022/0221918 A1     Jul. 14, 2022

(51) Int. Cl.
| | |
|---|---|
| *G06F 1/20* | (2006.01) |
| *G06F 16/245* | (2019.01) |
| *H05K 7/20* | (2006.01) |
| *G05D 16/20* | (2006.01) |

(52) U.S. Cl.
CPC ............ *G06F 1/203* (2013.01); *G06F 1/206* (2013.01); *G06F 16/245* (2019.01); *H05K 7/20209* (2013.01); *G05D 16/2073* (2013.01); *G06F 2200/201* (2013.01)

(58) Field of Classification Search
CPC ........ G06F 1/203; G06F 1/206; G06F 16/245; G06F 2200/201; G05D 16/2073; G05D 23/1917
See application file for complete search history.

(56) References Cited

U.S. PATENT DOCUMENTS

| | | | |
|---|---|---|---|
| 7,121,146 B1 | 10/2006 | Hopper et al. | |
| 2006/0128068 A1* | 6/2006 | Murray | H01L 21/4882 438/120 |
| 2010/0296946 A1 | 11/2010 | Chen et al. | |

OTHER PUBLICATIONS

Rezvani et al., Simultaneous Clamping and Cutting Force Measurements with Built-In Sensors; Sensors 2020, 20, 3736; http://www.mdpi.com/journal/sensors; Jul. 3, 2020; 20 pages.
Force Washer Transducer, Series FT4000; PCB Piezotronics, Inc., https://www.pcb.com/sensors-for-test-measurement/fastener-technology/fastener-testing/force-washer-transducer; Jul. 2020; 3 pages.

(Continued)

*Primary Examiner* — Charles R Kasenge
(74) *Attorney, Agent, or Firm* — Larson Newman, LLP

(57) ABSTRACT

A quality of a mechanical connection within an information handling system may be inferred based on pressure. An electronic pressure sensor is disposed between two components operating within the information handling system. The electronic pressure sensor generates an output signal in response to a clamping pressure and/or clamping force between the two components. Performance of a processor operating within the information handling system may be controlled in response to the clamping pressure and/or clamping force. A speed of a cooling fan operating within the information handling system may be controlled in response to the clamping pressure and/or clamping force. Any internal components operating within the information handling system may be controlled in response to the clamping pressure and/or clamping force.

20 Claims, 11 Drawing Sheets

(56) References Cited

OTHER PUBLICATIONS

Comparison of Interface Pressure Measurement Optons; Tekscan, Inc., https://www.tekscan.com/resources/ whitepaper/comparison-interface-pressure-measurement-options; Aug. 13, 2008; 22 pages.
Adafruit Round Force-Sensitive Resistor (FSR) [ADA166]; Adafruit Industries, https://www.amazon.com/Adafruit-Round-Force-Sensitive-Resistor-FSR/dp/B00XW2MIRQ; May 19, 2015; 7 pages.

* cited by examiner

THERMAL AND ACOUSTICAL MANAGEMENT IN INFORMATION HANDLING SYSTEMS BASED ON MECHANICAL CONNECTIONS

FIELD OF THE DISCLOSURE

This disclosure generally relates to information handling systems, and more particularly relates to thermal and acoustic management using pressure and clamping force.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A quality of a mechanical connection within an information handling system may be inferred. In a laptop computer, for example, a heat sink and a system board assembly are mechanically screwed together. The heat sink draws waste heat from the system board assembly, and a cooling fan blows cooling air across the heat sink to prevent the system board assembly from overheating. An electronic pressure sensor is disposed between the heat sink and the system board assembly. The electronic pressure sensor generates an output signal in response to a clamping force created between the heat sink and the system board assembly. The quality of the mechanical connection between the heat sink and the system board assembly may be inferred, based on the output signal generated by the electronic pressure sensor. If the output signal is within a normal specification, then the clamping force created between the heat sink and the system board assembly is normal, and the laptop computer may operate its processors and cooling fan(s) at full electrical power. When, however, the output signal generated by the electronic pressure sensor is abnormal, then the heat sink and the system board assembly may be inadequately clamped together. The system board assembly and the cooling fan may thus be controlled, based on the output signal generated by the electronic pressure sensor.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings.

Figure 1:
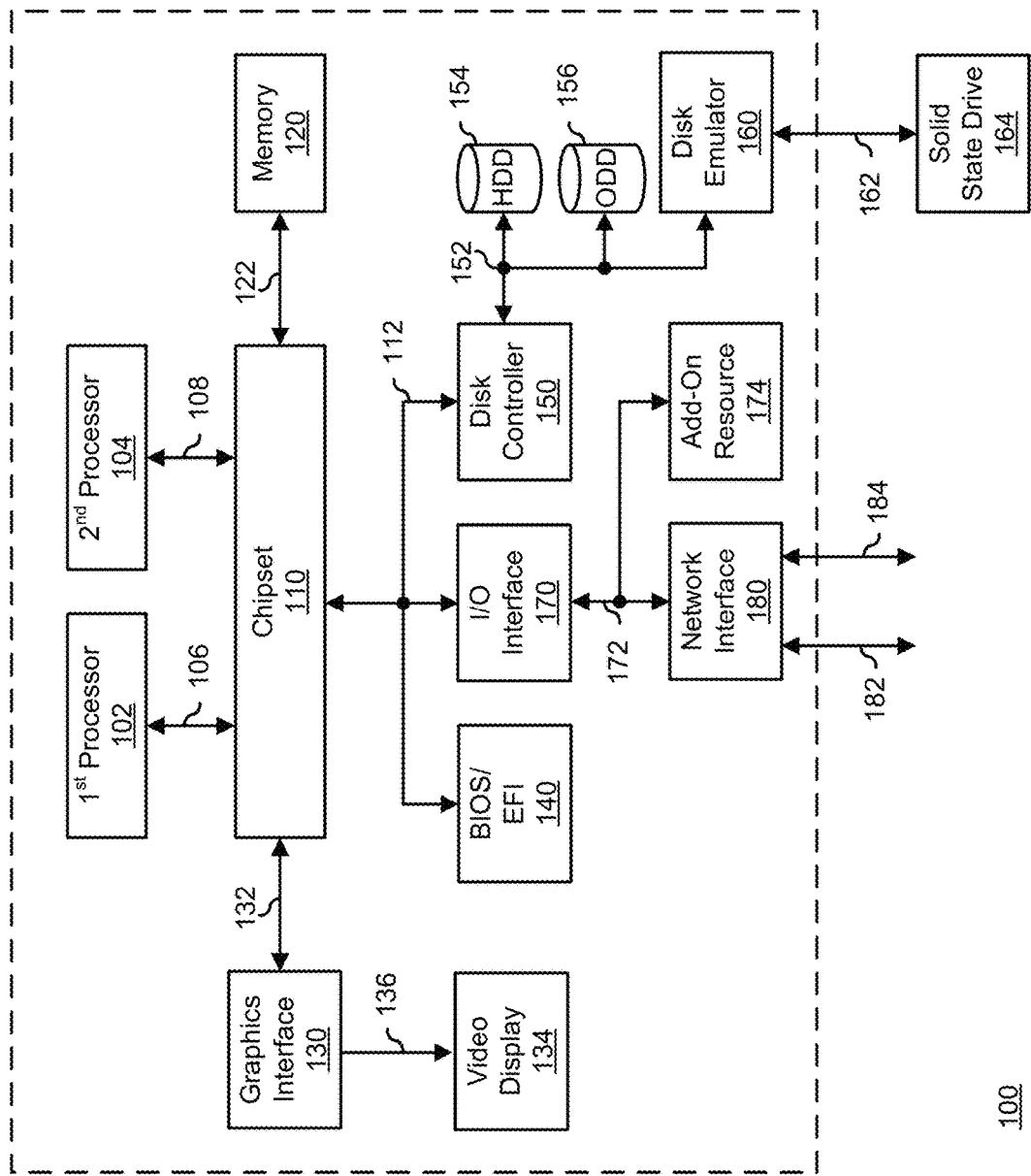
FIG. 1 is a block diagram of a generalized information handling system.

FIG. 1 illustrates an embodiment of an information handling system 100 including processors 102 and 104, chipset 110, memory 120, graphics adapter 130 connected to video display 134, non-volatile RAM (NV-RAM) 140 that includes a basic input and output system/extensible firmware interface (BIOS/EFI) module 142, disk controller 150, hard disk drive (HDD) 154, optical disk drive (ODD) 156, disk emulator 160 connected to solid state drive (SSD) 164, an input/output (I/O) interface 170 connected to an add-on resource 174, and a network interface device 180. Processor 102 is connected to chipset 110 via processor interface 106, and processor 104 is connected to chipset 110 via processor interface 108.

Chipset 110 represents an integrated circuit or group of integrated circuits that manages data flow between processors 102 and 104 and the other elements of information handling system 100. In a particular embodiment, chipset 110 represents a pair of integrated circuits, such as a north bridge component and a south bridge component. In another embodiment, some or all of the functions and features of chipset 110 are integrated with one or more of processors 102 and 104. Memory 120 is connected to chipset 110 via a memory interface 122. An example of memory interface 122 includes a Double Data Rate (DDR) memory channel, and memory 120 represents one or more DDR Dual In-Line Memory Modules (DIMMs). In a particular embodiment, memory interface 122 represents two or more DDR channels. In another embodiment, one or more of processors 102 and 104 include memory interface 122 that provides a dedicated memory for the processors. A DDR channel and the connected DDR DIMMs can be in accordance with a particular DDR standard, such as a DDR3 standard, a DDR4 standard, a DDR5 standard, or the like. Memory 120 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM) devices, or the like.

Graphics adapter 130 is connected to chipset 110 via a graphics interface 132, and provides a video display output 136 to a video display 134. An example of a graphics interface 132 includes a peripheral component interconnect-express interface (PCIe) and graphics adapter 130 can include a four lane (x4) PCIe adapter, an eight lane (x8) PCIe adapter, a 16-lane (x16) PCIe adapter, or another configuration, as needed or desired. In a particular embodiment, graphics adapter 130 is provided on a system printed circuit board (PCB). Video display output 136 can include a digital video interface (DVI), a high definition multimedia interface (HDMI), DisplayPort interface, or the like. Video display 134 can include a monitor, a smart television, an embedded display such as a laptop computer display, or the like.

NV-RAM 140, disk controller 150, and I/O interface 170 are connected to chipset 110 via I/O channel 112. An example of I/O channel 112 includes one or more point-to-point PCIe links between chipset 110 and each of NV-RAM 140, disk controller 150, and I/O interface 170. Chipset 110 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. NV-RAM 140 includes BIOS/EFI module 142 that stores machine-executable code (BIOS/EFI code) that operates to detect the resources of information handling system 100, to provide drivers for the resources, to initialize the resources, and to provide common access mechanisms for the resources. The functions and features of BIOS/EFI module 142 will be further described below.

Disk controller 150 includes a disk interface 152 that connects the disc controller 150 to HDD 154, to ODD 156, and to disk emulator 160. Disk interface 152 may include an integrated drive electronics (IDE) interface, an advanced technology attachment (ATA) such as a parallel ATA (PATA) interface or a serial ATA (SATA) interface, a SCSI interface, a USB interface, a proprietary interface, or a combination thereof. Disk emulator 160 permits a solid-state drive (SSD) 164 to be connected to information handling system 100 via an external interface 162. An example of external interface 162 includes a USB interface, an IEEE 1394 (Firewire) interface, a proprietary interface, or a combination thereof. Alternatively, SSD 164 can be disposed within information handling system 100.

I/O interface 170 includes a peripheral interface 172 that connects I/O interface 170 to add-on resource 174, to TPM 176, and to network interface device 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a sound card, data storage system, an additional graphics interface, another add-on resource, or a combination thereof. Add-on resource 174 can be on a main circuit board, a separate circuit board or an add-in card disposed within information handling system 100, a device that is external to the information handling system, or a combination thereof.

Network interface device 180 represents a network communication device disposed within information handling system 100, on a main circuit board of the information handling system, integrated onto another element such as chipset 110, in another suitable location, or a combination thereof. Network interface device 180 includes a network channel 182 that provides an interface to devices that are external to information handling system 100. In a particular embodiment, network channel is of a different type than peripheral channel 172 and network interface device 180 translates information from a format suitable to the peripheral channel to a format suitable to external devices. In a particular embodiment, network interface device 180 includes a host bus adapter (HBA), a host channel adapter, a network interface card (NIC), or other hardware circuit that can connect the information handling system to a network. An example of network channel 182 includes an InfiniBand channel, a fiber channel, a gigabit Ethernet channel, a proprietary channel architecture, or a combination thereof. Network channel 182 can be connected to an external network resource (not illustrated). The network resource can include another information handling system, a data storage system, another network, a grid management system, another suitable resource, or a combination thereof.

The information handling system 100 may include a baseboard management controller (BMC). The BMC is connected to multiple elements of information handling system 100 via one or more management interface to provide out of band monitoring, maintenance, and control of the elements of the information handling system. As such, BMC represents a processing device different from processors 102 and 104, which provides various management functions for information handling system 100. In an embodiment, BMC may be responsible for granting access to a remote management system that may establish control of the elements to implement power management, cooling management, storage management, and the like. The BMC may also grant access to an external device. In this case, the BMC may include transceiver circuitry to establish wireless communications with the external device such as a mobile device. The transceiver circuitry may operate on a Wi-Fi channel, a near-field communication (NFC) channel, a Bluetooth or Bluetooth-Low-Energy (BLE) channel, a cellular based interface such as a global system for mobile (GSM) interface, a code-division multiple access (CDMA) interface, a universal mobile telecommunications system (UMTS) interface, a long-term evolution (LTE) interface, another cellular based interface, or a combination thereof. A mobile device may include Ultrabook, a tablet computer, a netbook, a notebook computer, a laptop computer, mobile telephone, a cellular telephone, a smartphone, a personal digital assistant, a multimedia playback device, a digital music player, a digital video player, a navigational device, a digital camera, and the like.

The term BMC may be used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller, and embedded controllers included at the blades of the blade server can be referred to as blade management controllers. Out-of-band communication interfaces between BMC and elements of the information handling system may be provided by management interface that may include an inter-integrated circuit (I2C) bus, a system management bus (SMBUS), a power management bus (PMBUS), a low pin count (LPC) interface, a serial bus such as a universal serial bus (USB) or a serial peripheral interface (SPI), a network interface such as an Ethernet interface, a high-speed serial data link such as PCIe interface, a network controller-sideband interface (NC-SI), or the like. As used herein, out-of-band access refers to operations performed apart from a BIOS/operating system execution environment on information handling system 100, that is apart from the execution of code by processors 102 and 104 and procedures that are implemented on the information handling system in response to the executed code.

In an embodiment, the BMC implements an integrated remote access controller (iDRAC) that operates to monitor and maintain system firmware, such as code stored in BIOS/EFI module 142, option ROMs for graphics interface 130, disk controller 150, add-on resource 174, network interface 180, or other elements of information handling system 100, as needed or desired. In particular, BMC includes a network interface that can be connected to a remote management system to receive firmware updates, as needed or desired. Here BMC receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC utilizes various protocols and application programming interfaces (APIs) to direct and control the processes for monitoring and maintaining the system firmware. An example of a protocol or API for monitoring and maintaining the system firmware includes a graphical user interface (GUI) associated with BMC, an interface defined by the Distributed Management Taskforce (DMTF) (such as Web Services Management (WS-MAN) interface, a Management Component Transport Protocol (MCTP) or, Redfish interface), various vendor defined interfaces (such as Dell EMC Remote Access Controller Administrator (RACADM) utility, Dell EMC Open Manage Server Administrator (OMSS) utility, Dell EMC Open Manage Storage Services (OMSS) utility, Dell EMC Open Manage Deployment Toolkit (DTK) suite), representational state transfer (REST) web API, a BIOS setup utility such as invoked by a "F2" boot option, or another protocol or API, as needed or desired.

In a particular embodiment, BMC is included on a main circuit board (such as a baseboard, a motherboard, or any combination thereof) of information handling system 100, or is integrated into another element of the information handling system such as chipset 110, or another suitable element, as needed or desired. As such, BMC can be part of an integrated circuit or a chip set within information handling system 100. BMC may operate on a separate power plane from other resources in information handling system 100. Thus BMC can communicate with the remote management system via network interface or the BMC can communicate with the external mobile device using its own transceiver circuitry while the resources or elements of information handling system 100 are powered off or at least in low power mode. Here, information can be sent from the remote management system or external mobile device to BMC and the information can be stored in a RAM or NV-RAM associated with the BMC. Information stored in the RAM may be lost after power-down of the power plane for BMC, while information stored in the NV-RAM may be saved through a power-down/power-up cycle of the power plane for the BMC.

In a typical usage case, information handling system 100 represents an enterprise class processing system, such as may be found in a datacenter or other compute-intense processing environment. Here, there may be hundreds or thousands of other enterprise class processing systems in the datacenter. In such an environment, the information handling system may represent one of a wide variety of different types of equipment that perform the main processing tasks of the datacenter, such as modular blade servers, switching and routing equipment (network routers, top-of-rack switches, and the like), data storage equipment (storage servers, network attached storage, storage area networks, and the like), or other computing equipment that the datacenter uses to perform the processing tasks.

Figure 2:
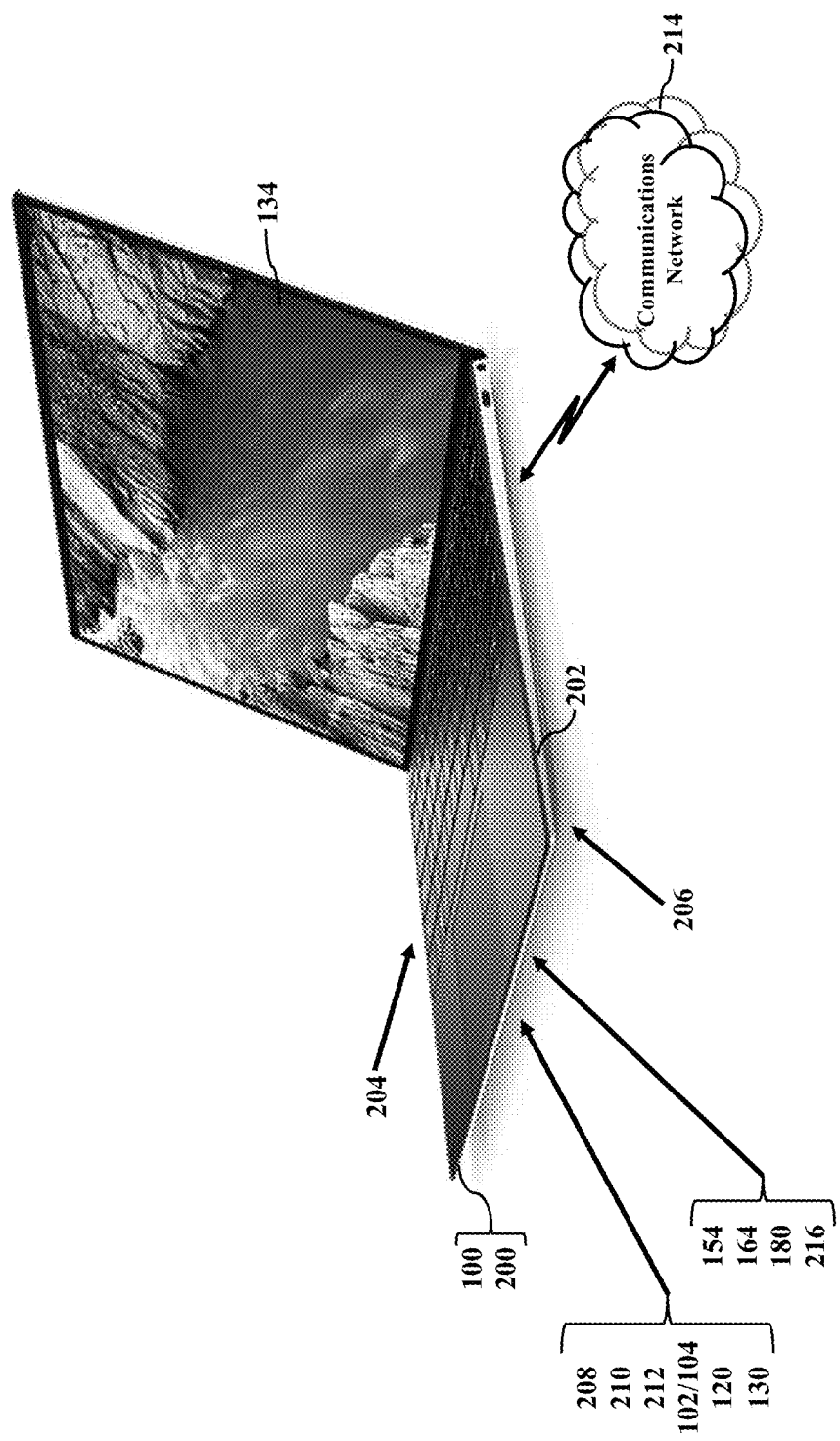
FIGS. 2-4 further illustrate the information handling system, according to exemplary embodiments.
Figure 3:
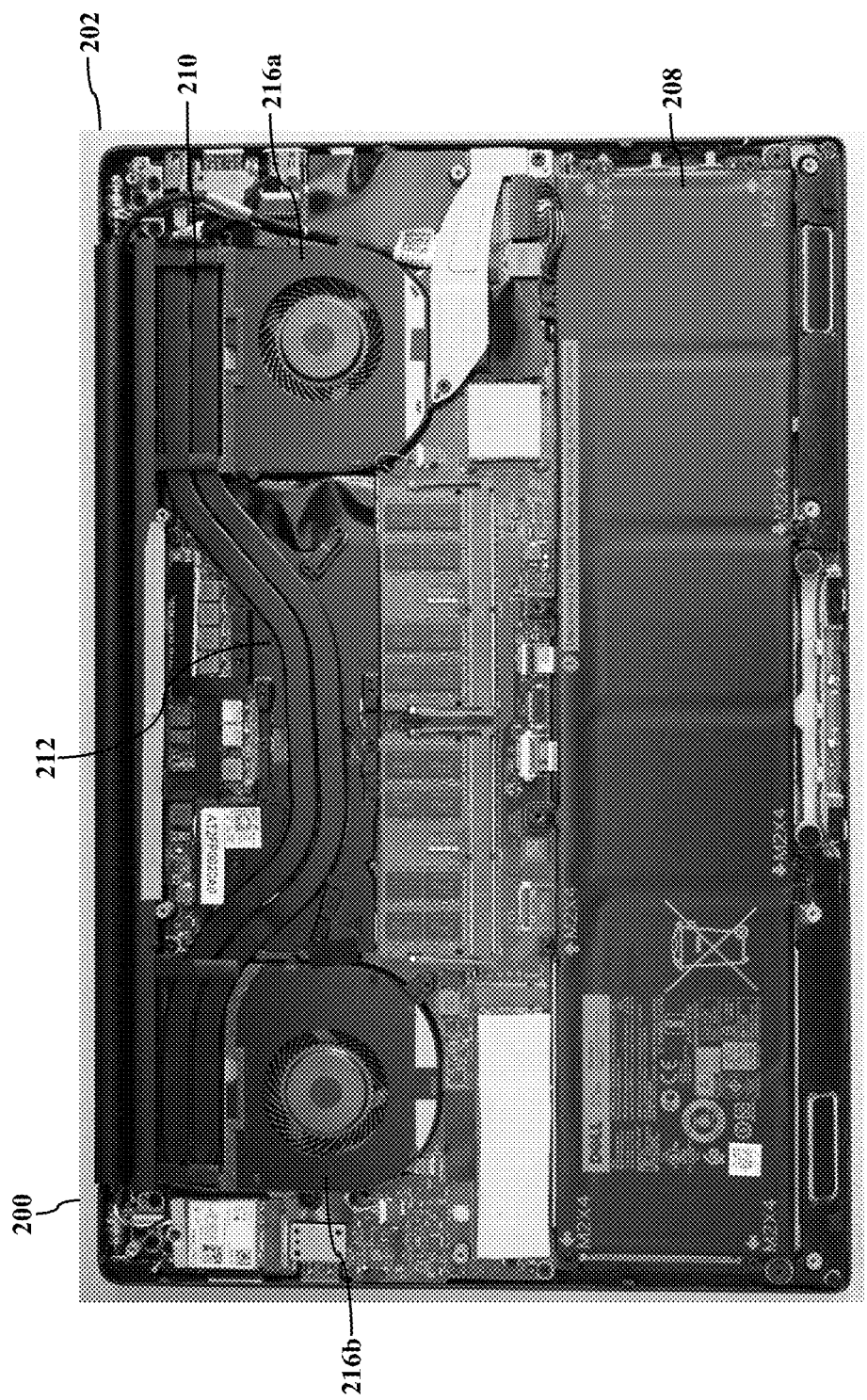
Figure 4:
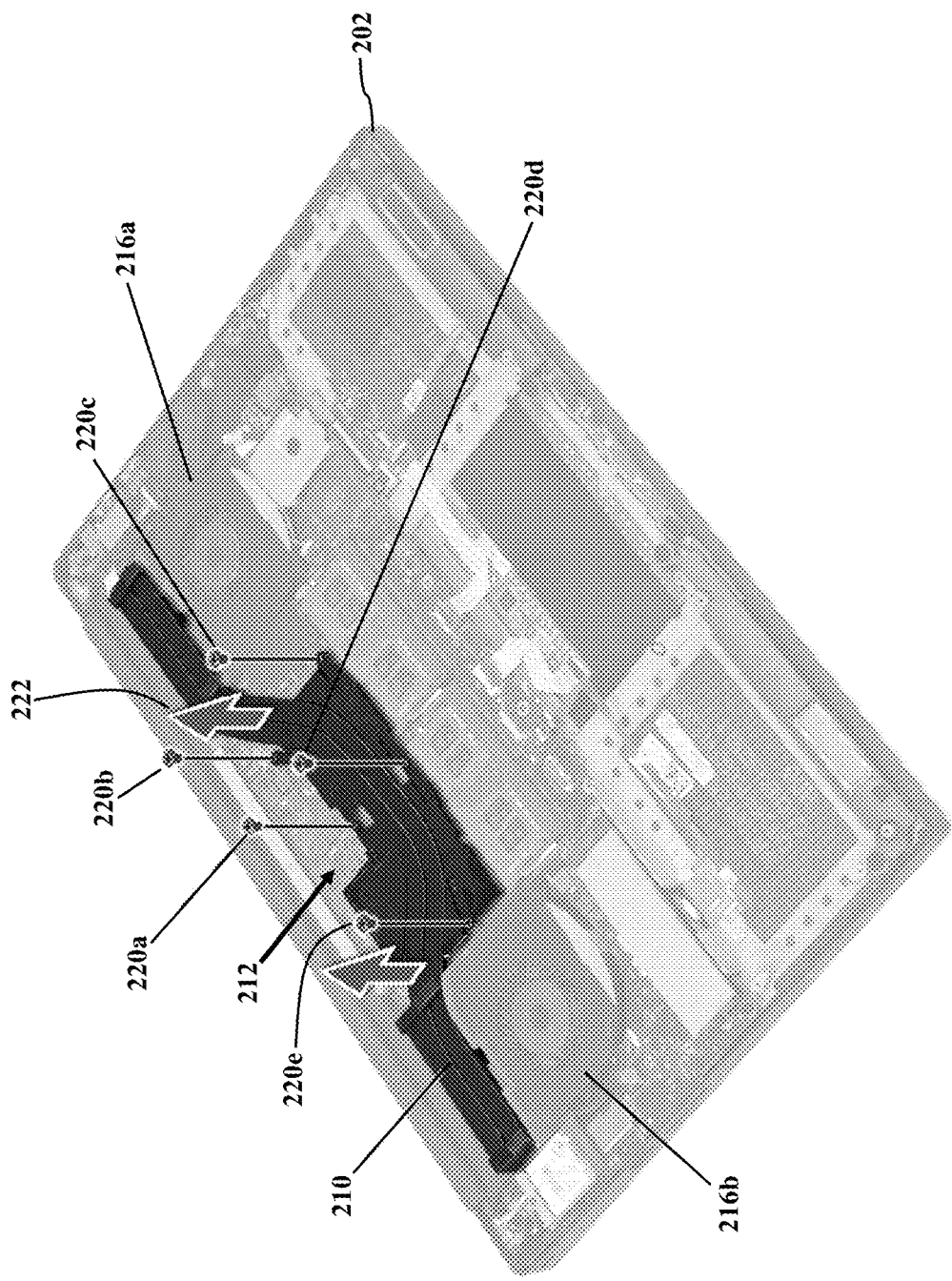

FIGS. 2-4 illustrate the information handling system as a laptop computer 200 having an outer enclosure 202 that houses or incorporates a keyboard 204 and the video display 134. A user may thus enter or input keystrokes and touches to launch software applications and to navigate the Internet. The enclosure 202 has a removable bottom base 206. When the user removes the bottom base 206 (such as by removing screws, not shown for simplicity), the user may access, inspect, and even remove and replace internal components. The enclosure 202, for example, houses an internal battery 208, a heat sink 210, and a system board assembly 212. The system board assembly 212 (or motherboard) integrates the processor(s) 102/104, the memory device 120, the graphics interface 130 (such as a graphical processing unit), and many other components. The enclosure 202 also houses the hard disk drive 154, the solid-state drive 164, the network interface 180 to a communications network 214, a cooling fan 216, and many other internal components.

FIGS. 3-4 illustrate internal views of the laptop computer 200. After a user or technician removes the bottom base 206 (illustrated in FIG. 2), the user or technician may access the internal componentry. While the laptop computer 200 has many internal components, FIG. 3 only illustrates some of the internal components that are relevant to this disclosure. For example the battery 208 provides electrical power, such as voltage and current, to the internal components. The heat sink 210 installs above the system board assembly 212. The laptop computer 200 has two cooling fans (illustrated as reference numerals 216a and 216b). As FIG. 4 particularly illustrates, the heat sink 210 installs above the system board assembly 212. The heat sink 210 secures to the system board assembly 212 using one or more mechanical fasteners 220. While any number or amount of the mechanical fasteners 220 may be used, FIG. 4 illustrates five screws 220a-220e. Each screw 220 inserts through respective screw holes in the heat sink 210 and the system board assembly 212. That is, when the heat sink 210 and the system board assembly 212 are correctly aligned, their respective screw holes are substantially concentric. Each screw 220a-e may thus be inserted through the corresponding screw holes in the heat sink 210 and in the system board assembly 212. Each screw 220 is drive via rotational torque into an aligning/mating mounting hole in the enclosure 202. The heat sink 210 is thus secured above and onto the system board assembly 212.

The heat sink 210 dissipates thermal heat. As the system board assembly 212 consumes the electrical power provided by the battery 208, the system board assembly 212 generates waste heat. As the processor(s) 102/104 and/or the memory devices 120 (illustrated in FIG. 2) consume electrical power, such as voltage and current), much heat is generated. The heat sink 210 may thus be aligned above, and/or in close proximity to, the system board assembly 212. Indeed, the heat sink 210 is preferably in direct physical contact with the processor(s) 102/104, and/or the memory devices 120, and/or the system board assembly 212. Because the heat sink 210 is constructed or machined of any thermally conductive material (such as copper, aluminum, or other metal), the heat energy generated by the system board assembly 212 rises into and conducts along the heat sink 210. The heat sink 210 stores and radiates the heat energy, and the cooling fans 216 blow or move the heat along a fluid flow path to an exhaust vent in the enclosure 202. The heat generated by the system board assembly 212 is thus carried away and expelled to ambient.

Mis-mounting, however, may greatly reduce thermal conduction and convection. If the mechanical fasteners 220 are mis-driven, such as over-torqued or under-torqued, the heat sink 210 and/or the system board assembly 212 may be mechanically loose, which reduces thermal conduction and convection. For example, if the mechanical fasteners 220 are driven too hard and over-torqued, the heat sink 210 and/or the system board assembly 212 may locally crack or break and be mechanically loose. Any mounting issues, or even a broken mounting mechanism, can cause a reduction or even loss of thermal conduction/convection between the heat sink 210 and the system board assembly 212. The processor(s) 102/104, the memory devices 120, and/or the system board assembly 212 may thus overheat and even cause a thermal shutdown. Moreover, the heat sink 210 and/or the system board assembly 212 may vibrate or even rattle, especially when the cooling fan(s) 216 operate. Indeed, because thermal conduction/convection is reduced, the fans 216 may continuously and noisily operate at full electrical power to blow air over/across either component.

Figure 5:
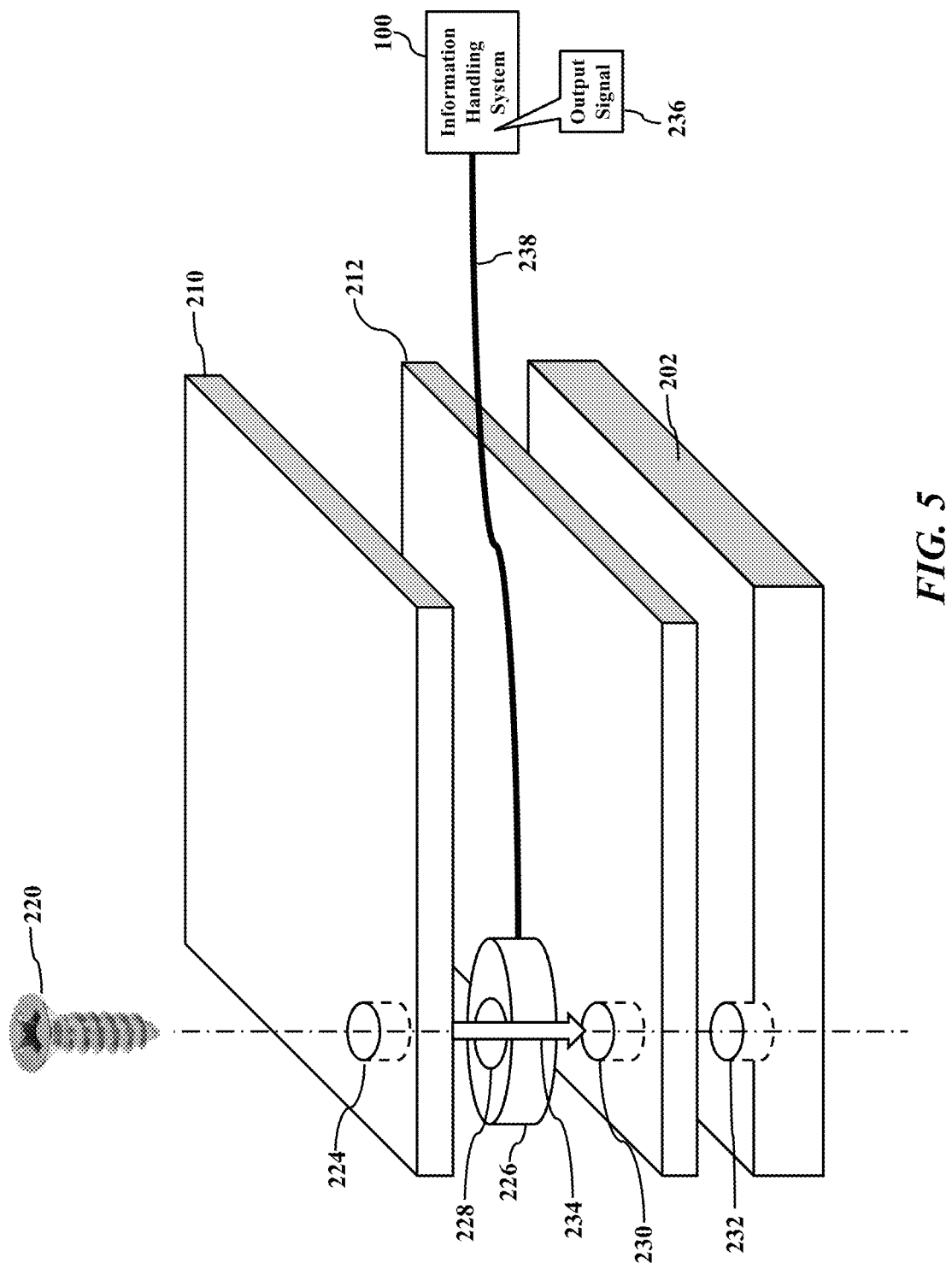
FIG. 5 illustrates mechanical surface pressure management, according to exemplary embodiments.

FIG. 5 illustrates mechanical surface pressure management, according to exemplary embodiments. FIG. 5 illustrates portions of the enclosure 202, the heat sink 210, and the system board assembly 212 aligned for insertion of the mechanical fastener 220. The mechanical fastener 220 (illustrated as a threaded screw 222) inserts through a corresponding through hole 224 in the heat sink 210. Here, though, the mechanical fastener assembly includes or incorporates an electronic pressure sensor 226. FIG. 5 illustrates the electronic pressure sensor 226 designed as a ring or washer having a center bore/hole 228 through which the tip/shank of the mechanical fastener 220 inserts. The electronic pressure sensor 226 may thus be a separate component that inserts between a bottom surface of the heat sink 210 and an upper/top surface of the system board assembly 212. The center bore/hole 228 has a diameter sized to accept, pass, and clear the diameter of the mechanical fastener 220. The mechanical fastener 220 is further inserted into and through a corresponding through hole 230 in the system board assembly 212 and finally into a mounting hole 232 in the enclosure 202.

The heat sink 210 and the system board assembly 212 are clamped together. As the mechanical fastener 220 is driven via rotational torque into the mounting hole 232 in the enclosure 202, the heat sink 210 and the system board assembly 212 are compressed together and secured to the enclosure 202. The mechanical fastener 220 thus causes or induces a mechanical clamping force 234 (created by and within the mechanical fastener 220) between the heat sink 210, the system board assembly 212, and/or the enclosure 202. The heat sink 210 and the system board assembly 212 are drawn and clamped together.

The electronic pressure sensor 226 generates an output signal 236. As the mechanical fastener 220 is driven via rotational torque, the heat sink 210 and the system board assembly 212 are compressed and clamped together. Because the electronic pressure sensor 226 is sandwiched between the heat sink 210 and the system board assembly 212, the electronic pressure sensor 226 generates the output signal 236 in response to the mechanical clamping force 234 distributed over a surface area of the electronic pressure sensor 226. The electronic pressure sensor 226 interfaces with the information handling system 100 (such as a via a physical electrical connection 238). The information handling system 100 may thus receive and analyze the output signal 236. The output signal 236 may represent a quality of the mechanical connection between the heat sink 210 and the system board assembly 212.

Figure 6:
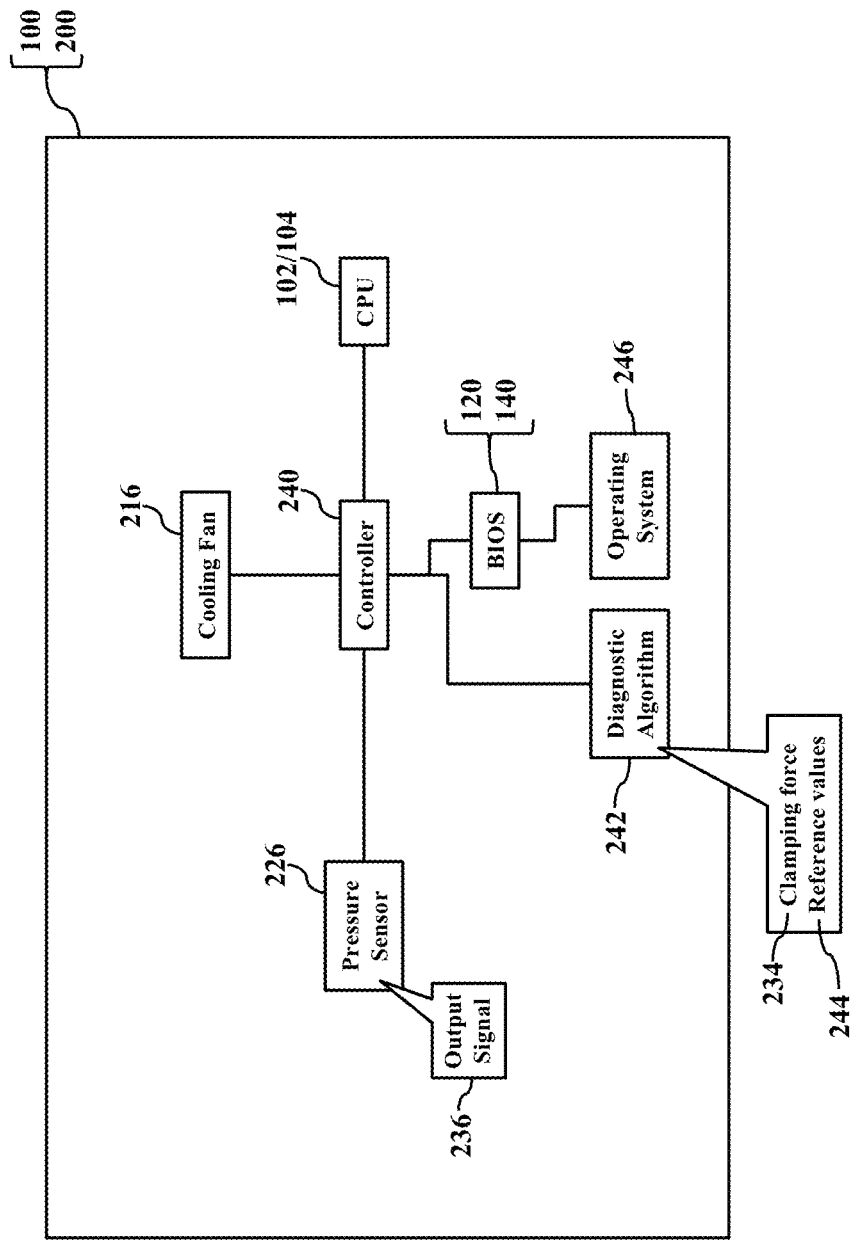
FIG. 6 illustrates analysis of an output signal, according to exemplary embodiments.

FIG. 6 illustrates analysis of the output signal 236, according to exemplary embodiments. The electronic pressure sensor 226 is electrically connected to an electronic controller 240. The electronic controller 240 thus receives the output signal 236 generated by the electronic pressure sensor 226. While not illustrated, the electronic controller 240 may call or perform an analog-to-digital conversion of the output signal 236, if necessary or needed.

The electronic controller 240 infers the adequacy of the mechanical connection. The electronic controller 240 may have a hardware processor and memory device (not shown for simplicity) that store and execute a diagnostic algorithm 242. The diagnostic algorithm 242 includes programming code or instructions that cause or instruct the electronic controller 240 and/or the hardware processor 102/104 to perform operations, such as comparing the output signal 236 to one or more reference values 244. The reference values 244, for example, may be associated with pre-set or predetermined high/low limits on the clamping force 234 (created by the mechanical fastener 220 between the heat sink 210, the system board assembly 212, and the enclosure 202, as illustrated with reference to FIG. 5). The electronic controller 240 may thus interface with the processors 102/104, the memory/BIOS 120/140, and/or an operating system 246 to control the operation of the cooling fan 216, and/or the processors 102/104, based on output signal 236 generated by the electronic pressure sensor 226.

Figure 7:
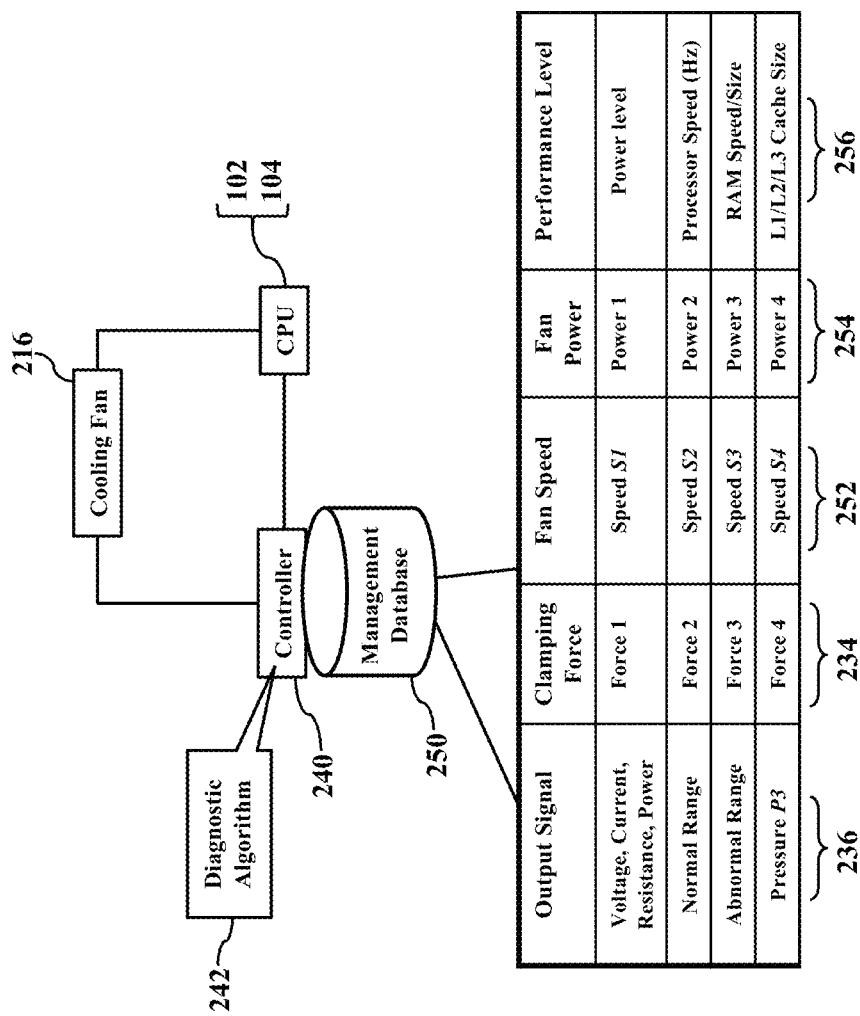
FIG. 7 further illustrates mechanical surface pressure management, according to exemplary embodiments

FIG. 7 further illustrates mechanical pressure management, according to exemplary embodiments. The electronic controller 240 may access an electronic management database 250. The electronic management database 250 is illustrated as being locally stored by the electronic controller 240, but the electronic management database 250 may be stored by the memory 120 and/or the BIOS 140 (illustrated in FIG. 1). Some or all portions of the electronic management database 250 may be remotely stored and accessed via the communications network 214 located (illustrated in FIG. 1).

While the electronic management database 250 may have any logical structure, FIG. 6 illustrates a relational table having database entries that map, relate, or associate different values of the output signal 236 (generated by the electronic pressure sensor 226) to their corresponding clamping forces 234 and to their pre-set or predetermined operating conditions/states for the cooling fan 216 and/or the processors 102/104. When the electronic controller 240 receives or determines the output signal 236, the electronic controller 240 may query the electronic management database 250 for a value (such as voltage, current, or resistance represented by the output signal 236) and identify and retrieve the corresponding clamping force 234. The electronic controller 240 may also identify and retrieve the corresponding fan speed 252 or fan electrical power 254, such as voltage and/or current. The electronic controller 240 may thus determine the clamping force 234, based on the output signal 236 generated by the electronic pressure sensor 226. The electronic controller 240 may thus determine or infer the quality of the mechanical connection securing the heat sink 210 to the system board assembly 212, based on the output signal 236 and/or the clamping force 234. The electronic controller 240 may further interface with the processors 102/104 to control the speed, power voltage, and/or current associated with the cooling fan 216, again according to the mechanical connection between the heat sink 210 to the system board assembly 212.

The operation of the processors 102/104 may also be adjusted. When the electronic controller 240 receives the output signal 236 generated by the electronic pressure sensor 226, the electronic controller 240 infers the clamping force 234 and identifies/retrieves the corresponding operational state of the processors 102/104. The electronic management database 250 may have entries that map different values of the output signal 236 to different processor performance levels 256. The output signal 236 may thus determine a permissible or maximum amount of electrical power consumed by the processors 102/104, a permissible or maximum clock speed, a permissible or maximum RAM/ROM memory usage, and/or a permissible or maximum cache memory size or speed. Additional or other performance levels 256 may define or specify processor cores, dies, threads, and other hardware/software resources, according to or based on the output signal 236. The electronic controller 240 may thus further control or command the performance of the processors 102/104, according to the mechanical connection between the heat sink 210 to the system board assembly 212.

Exemplary embodiments may thus correlate mechanical pressure and the clamping force 234 to performance. The output signal 236 generated by the electronic pressure sensor 226 reflects or indicates the clamping force 234 and the mechanical fastening quality between the heat sink 210, the system board assembly 212, and the enclosure 202. The electronic management database 250 that thus have entries reflecting a normal, in-specification range of values for the output signal 236 and/or the clamping force 234. When the output signal 236 (and/or the mechanical clamping force 234) has a value that lies within or inside the range of normal values, the electronic controller 240 and/or the hardware processors 102/104 may infer that the mechanical connection (between the heat sink 210, the system board assembly 212, and/or the enclosure 202) is adequate and within specification. However, when the output signal 236 has a value that lies outside the range of normal values, the electronic controller 240 and/or the hardware processors 102/104 may infer that the mechanical connection (between the heat sink 210, the system board assembly 212, and the enclosure 202) is inadequate and out-of-specification. Exemplary embodiments may thus monitor the mechanical pressure and/or the clamping force 234 to control hardware and memory resources to manage acoustic and thermal excursions.

Figure 8:
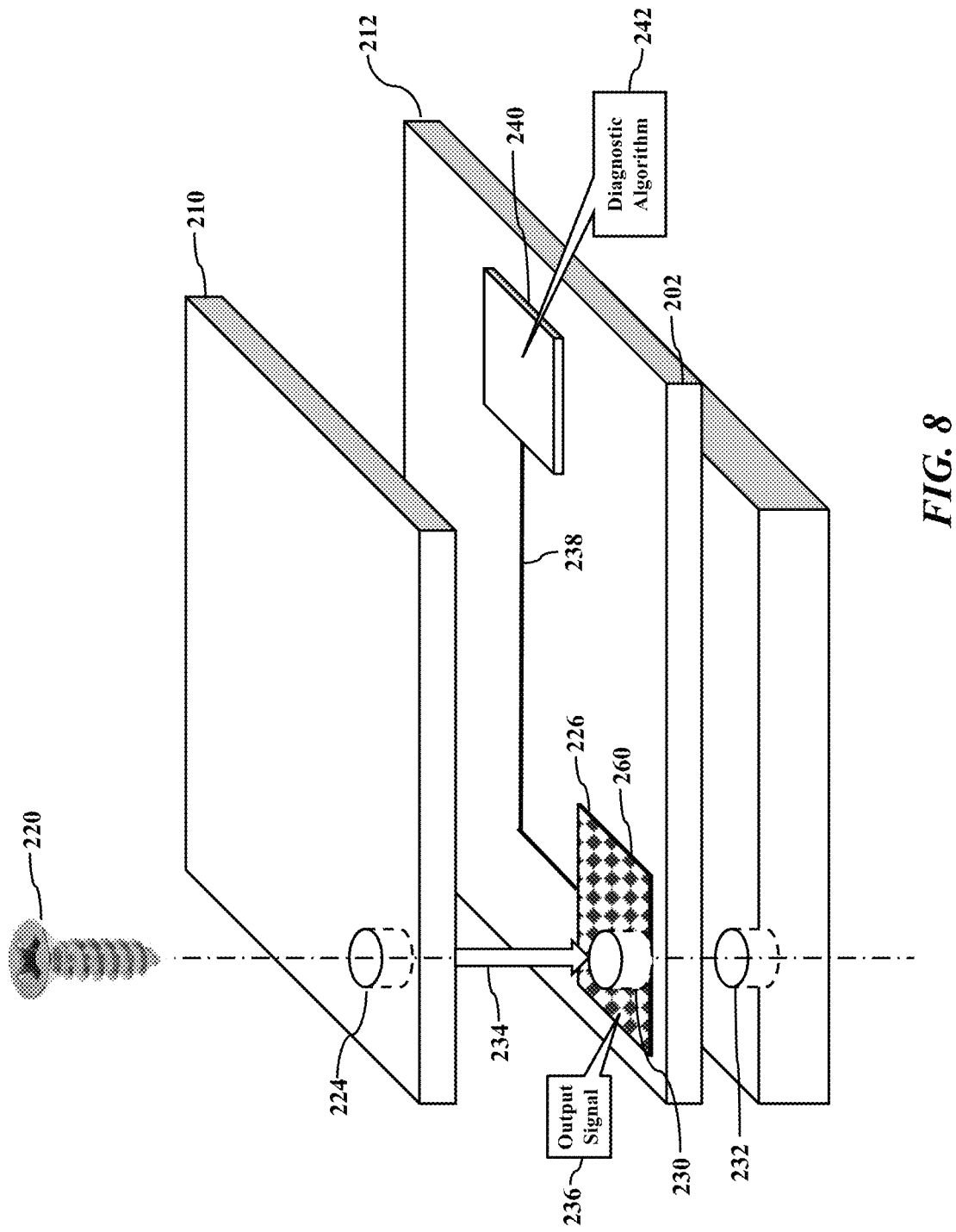
FIGS. 8-10 illustrate circuit or board integration, according to exemplary embodiments.
Figure 9:
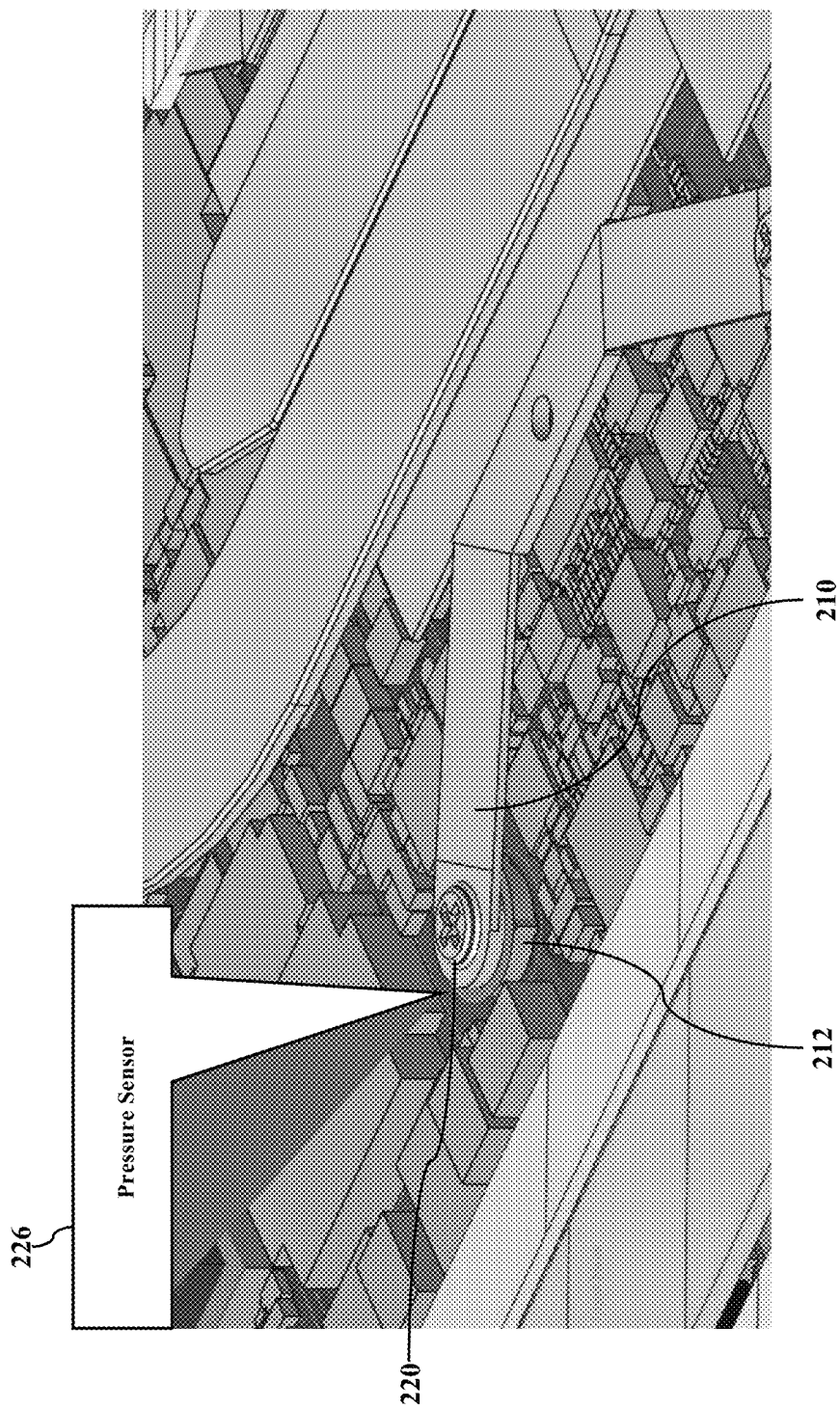
Figure 10:
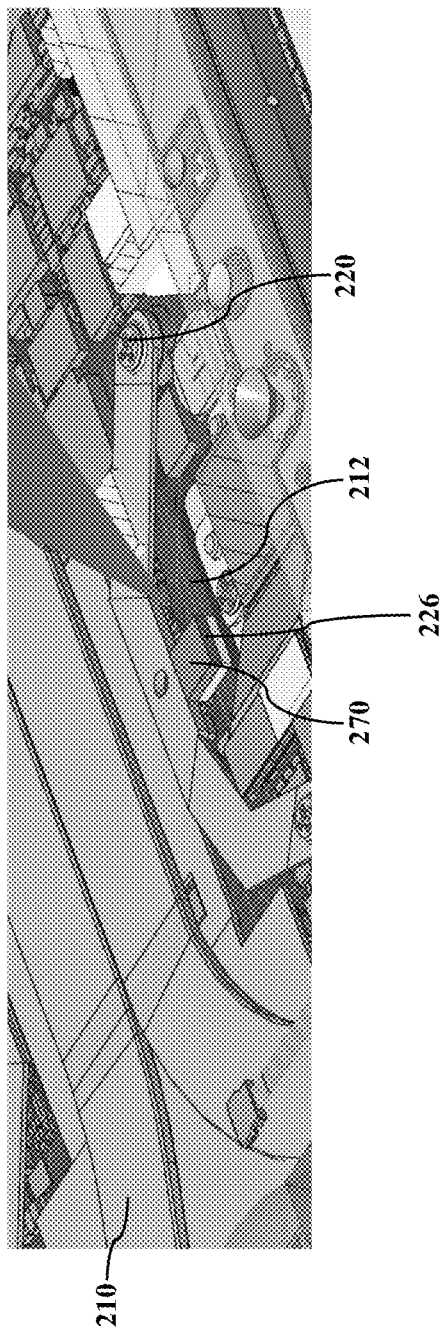

FIGS. 8-10 illustrate circuit or board integration, according to exemplary embodiments. This disclosure above explains and illustrates the electronic pressure sensor 226 as a separate component that is added to a stacked assembly of the heat sink 210 and the system board assembly 212. FIG. 8, though, illustrates the electronic pressure sensor 226 incorporated as an electrical circuit 260 into the system board assembly 212. As the mechanical fastener 220 is torqued to compress the mechanical joint between the heat sink 210 and the system board assembly 212, the electronic pressure sensor 226 generates its output signal 236 in response to the pressure, that is the clamping force 234 spread over the surface area defined by opposing surfaces representing the heat sink 210 and the system board assembly 212. Because the electronic pressure sensor 226 interfaces with the electronic controller 240 (such as a via the physical electrical connection 238, exemplary embodiments may receive and analyze the output signal 236 to infer the quality of the mechanical connection between the heat sink 210 and the system board assembly 212.

The electronic pressure sensor 226 may thus be a component of the system board assembly 212. The system board assembly 212 is a printed circuit board containing many computer/processor/memory/networking components. For example, the processors 102/104, the memory 120/140, and the electronic controller 240 may components that are soldered to the system board assembly 212. The electronic pressure sensor 226 may also be a component that is soldered to the system board assembly 212. The electronic pressure sensor 226, however, may also be small, miniature transistors, resisters, capacitors, inductors, and other circuitry components that are integrated into the printed circuit board. The electronic pressure sensor 226 is designed and located on the printed circuit board such that a drilling operation does not destroy its circuitry. So, as the clamping force 234 draws together the heat sink 210 and the system board assembly 212, the output signal 236 generated by the electronic pressure sensor 226 indicates the mechanical fastening quality. Exemplary embodiments may thus monitor the output signal 236 and/or the clamping force 234 to control hardware and memory resources to manage acoustic and thermal excursions.

FIG. 9 further illustrates the electronic pressure sensor 226. Here the electronic pressure sensor 226 is fabricated as a microelectromechanical system (MEMS) and electrically integrated with the system board assembly 212. The electronic pressure sensor 226 may thus be printed/masked as electronic copper components of the system board assembly 212. The electronic pressure sensor 226 may thus be integrated into a spring/screw assembly that stacks and secures the heat sink 210 and the system board assembly 212 to the enclosure 202.

FIG. 10 further illustrates the electronic pressure sensor 226. The electronic pressure sensor 226 is again an electrical component of the system board assembly 212. Here, though, the electronic pressure sensor 226 need not be a component of the mechanical screwed connection between the heat sink 210 and the system board assembly 212 to the enclosure 202. The electronic pressure sensor 226, instead, may be fabricated and located at any desired location between the heat sink 210 and the system board assembly 212. The electronic pressure sensor 226, in other words, need not be aligned with or concentric to the mechanical fastener 220. The electronic pressure sensor 226 may be a separate component, pad, or side car feature that extends from a copper plate/mask of the system board assembly 212. The system board assembly 212, for example, may include a thermal pad or extension 270 that upwardly extends or rises from an upper surface of the system board assembly 212. As the heat sink 210 and the system board assembly 212 are compressed together using the mechanical fastener 220, the thermal pad or extension 270 comes into physical and thermal contact with the bottom surface of the heat sink 210.

Exemplary embodiments may utilize any sensory technology. The electronic pressure sensor 226 and/or the system board assembly 212 may utilize or incorporate thin-film, tactile pressure technologies that measure force and pressure distribution between two contacting surfaces (such as between the heat sink 210 and the system board assembly 212). The electronic pressure sensor 226 and/or the system board assembly 212 may utilize or incorporate piezoelectric components that vary charge, voltage, current, and/or resistance in response to compression/pressure. The electronic pressure sensor 226 and/or the system board assembly 212 may utilize or incorporate diaphragms, transducers, and other components.

Performance is optimized based upon direct pressure measurement. If the output signal 236 (generated by the electronic pressure sensor 226) is out of range, the diagnostic algorithm 242 and/or the electronic management database 250 may manage acoustics and thermals by controlling the cooling fan 216 and/or the processors 102/104. If the mechanical connection is normal, for example, the cooling fan 216 and/or the processors 102/104 may be commanded or authorized to operate at full power and performance. A performance mode of operation may thus reflect, and take advantage of, normal output values generated by the electronic pressure sensor 226. However, if the mechanical connection is loose or failed, the output signal 236 may have abnormally high or low values. The cooling fan 216 and/or the processors 102/104 may be commanded or authorized to operate at reduced power and performance. A quieter mode of operation reduces speed/power/performance, compensates for a degraded/broken mechanical connection, and reduces thermal overheating and acoustical dissatisfaction.

The electronic management database 250 may have many pre-configured entries. This disclosure only explains and illustrates a few simple examples of fastener pressure-based control of heat and noise. In actual practice, though, the electronic management database 250 may have hundreds or even thousands of entries detailed specific instances of control. A minimum value of the output signal 236 may map or correlate to the minimum acceptable clamping force 234. If the output signal 236 falls below a minimum threshold value, the diagnostic algorithm 242 may cause or instruct the electronic controller 240 and/or the hardware processor 102/104 to infer that the mechanical connection (between the heat sink 210, the system board assembly 212, and the enclosure 202) is inadequate and out-of-specification. Indeed, a very low, or even zero/null, value of the output signal 236 may indicate that the fastener 220 is under-driven or perhaps even the mechanical connection has failed. However, if the output signal 236 rises above a maximum threshold value, the diagnostic algorithm 242 may cause or instruct the electronic controller 240 and/or the hardware processor 102/104 to infer that the mechanical connection (between the heat sink 210, the system board assembly 212, and the enclosure 202) is over-torqued and out-of-specification. Indeed, a high value of the output signal 236 may indicate that the fastener 220 is being over-driven and the mechanical connection may imminently fail.

Exemplary embodiments provide greater control and improve customer satisfaction. The electronic pressure sensor 226 directly measures or senses in-platform the mechanical pressure between two (2) surfaces (such as between the heat sink 210 and the system board assembly 212). Exemplary embodiments may then compare the output signal 236 (representing the mechanical pressure) to the entries specified by the electronic management database 250. If the value of the output signal 236 is within a range of normal values, then fan speed may correlate to fan noise. However, if the value of the output signal 236 is outside the range of normal values, an action may be taken or implemented, such as i) lowering electrical power limits to the processors 102/104, ii) lowering electrical power limits to the graphics interface 130 (or GPU), iii) change a power control unit (or pcode) slider/selection one step or increment toward best battery. Other actions may include diagnostic integration and notifications that alert the user, an administrator, and/or a service of the under/over pressures.

Exemplary embodiments may thus integrate the electronic pressure sensor 226 directly into any package or system. The electronic pressure sensor 226, for example, may be integrated into any system-on-chip, such as the system board assembly 212. The electronic pressure sensor 226, however, may be integrated into the hardware processors 102/104, any graphics processing unit, the memory 120/BIOS 140, network interface 180, any peripheral card (such as a PCIe), the drives 154, 156, and 164, the heat sink 210, the cooling fan 216, or any other component. A single electronic pressure sensor 226 may be adequate, but multiple electronic pressure sensors 226 (measuring or inferring the clamping force 234) may be designed and packaged at different locations for global, interior estimations of clamping forces. The electronic pressure sensor 226 may be located at corner of the die package or multi-die package. The capability to receive/read and analyze the output signal 236 may be integrated or embedded into any controlling component (such as the controller 240), and control actions may be executed based upon key settings such as change fan speed, alert user, users recommended intervention.) The electronic pressure sensor 226 may be integrated and located off package within any narrow or wide band of the package location. Exemplary embodiments allow for separation of a MEMs device to the hardware processors 102/104, any graphics processing unit, the memory 120/BIOS 140, and a power supply and/or voltage regulator. The heat sink 210 may have a feature of footprint designed to apply compressive mechanical pressure to the electronic pressure sensor 226, in response to the clamping force 234. Indeed, multiple electronic pressure sensors 226 dispersed or distributed between the heat sink 210 and the system board assembly 212 (such one of the electronic pressure sensors 226 monitoring each mechanical connection) may provide a more complete indication of thermal and acoustic performance.

Figure 11:
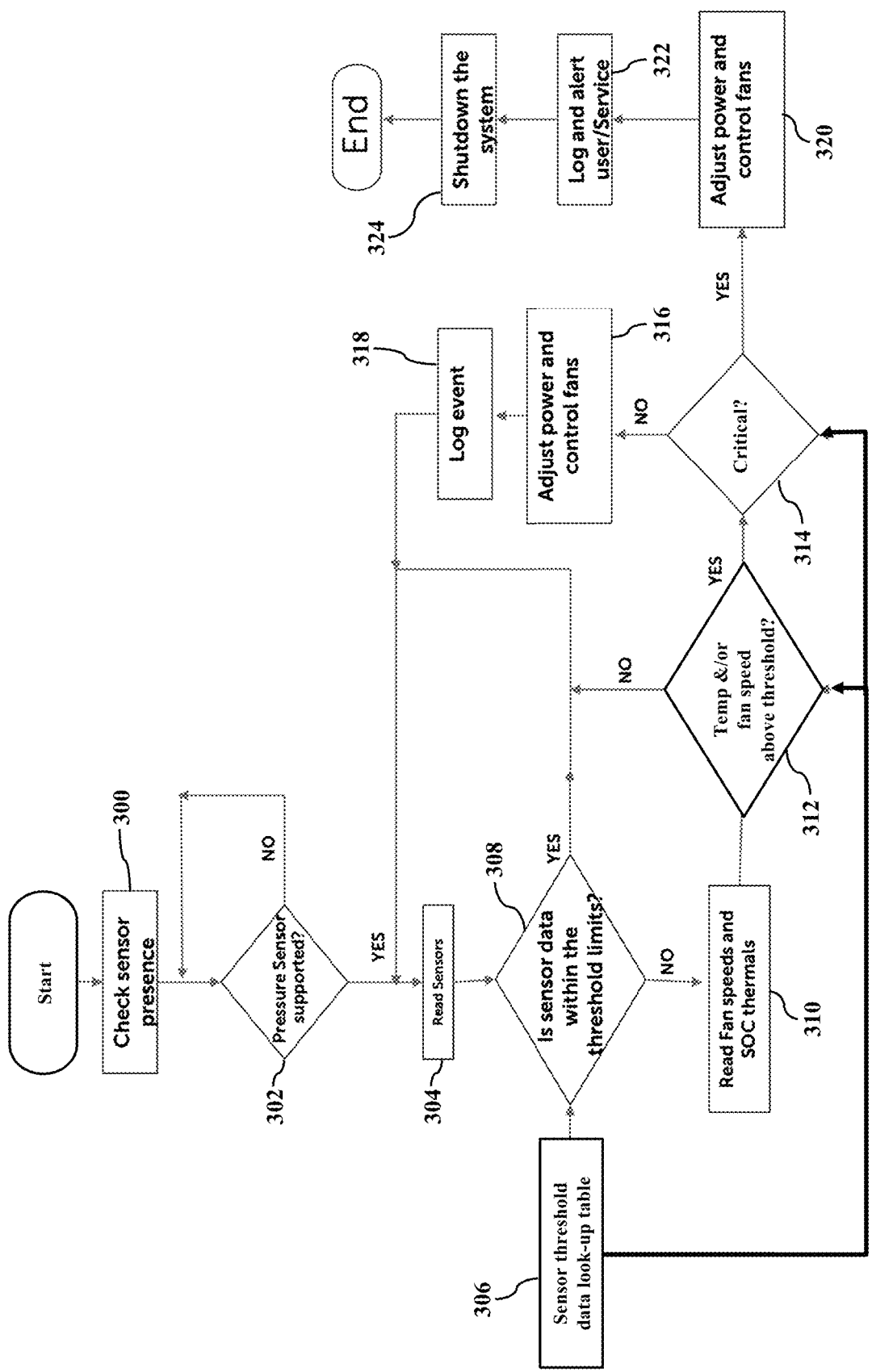
FIG. 11 is a flowchart illustrating a method or algorithm for inferring the quality or condition of a mechanical connection between a heat sink and a system board assembly, according to exemplary embodiments.

FIG. 11 is a flowchart illustrating a method or algorithm of inferring the quality or condition of a mechanical connection between the heat sink 210 and the system board assembly 212, according to exemplary embodiments. If a presence of the electronic pressure sensor 226 is determined (Block 300) (perhaps by the electronic controller 240 receiving the output signal 236), the output signal 236 is read (Block 304). Exemplary embodiments may read, load, and/or store acceptable, normal values and/or abnormal values associated with the output signal 236, the clamping force 234, the cooling fan 216, and/or the processors 102/104 (Block 306) and compare the output signal 236 (Block 308). If the output signal 236 and/or the clamping force 234 is within normal specification, then the mechanical connection between the heat sink 210 and the system board assembly 212 is also inferred to be within normal specification.

The processors 102/104 and/or the cooling fan 216 may operate under a normal condition, such as high power is authorized. However, if the output signal 236 and/or the clamping force 234 is not within the normal specification (Block 308), then exemplary embodiments may read, determine, and/or lookup current operating conditions or states associated with the cooling fan 216 (such as RPM speed or power consumption) and the processors 102/104 and/or the system board assembly 212 (current temperature or thermal conditions) (Block 310). If the processors 102/104 and/or the system board assembly 212 are within specification (Block 312), then normality is inferred and a new or current value of the output signal 236 is read (Block 304). However, if either or both of the processors 102/104 and/or the system board assembly 212 are out of specification (Block 312), then criticality is determined (Block 314).

If neither the processors 102/104, the system board assembly 212, nor the cooling fan 216 is/are critical in speed, temperature, or power, then the speed/power assigned to the cooling fan 216 may be adjusted (Block 316) and logged (Block 318), and new or current value of the output signal 236 is read (Block 304). However, if either or both of the processors 102/104, the system board assembly 212, and/or the cooling fan 216 is critical (speed, temperature, or power), then the speed/power assigned to the cooling fan 216 and/or the processors 102/104 is adjusted (Block 320) and logged (Block 322). Diagnostic notifications may be generated for display and communicated/sent to remote destinations. The diagnostic algorithm 242 may even force a shutdown due to thermal excursion (Block 324).

Exemplary embodiments thus present an elegant solution. The quality of the mechanical connection between the heat sink 210 and the system board assembly 212 may be inferred from the output signal 236 generated by the electronic pressure sensor 226. Once the output signal 236 is read or received, the clamping force 234 is identified (perhaps by querying the management database 250, as above explained). The RPM speed of the cooling fan 216 may thus be controlled, based on the clamping force 234. The electrical power consumption and performance of the processors 102/104 may also be controlled, based on the clamping force 234. If the mechanical joint or connection between the heat sink 210 and the system board assembly 212 is inadequate, the performance of the laptop computer 200 may be reduced to avoid thermal concerns and noisy operation. An electrical power shutdown may even be forced, in response to the clamping force 234 inferred from the output signal 236 generated by the electronic pressure sensor 226.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method, comprising:
receiving, by a hardware processor, an output value representing a mechanical clamping pressure between a heat sink and a system board assembly installed within an information handling system;
identifying a fan electrical power by querying an electronic database for the output value representing the mechanical clamping pressure between the heat sink and the system board assembly, the electronic database electronically associating output values to electrical powers including the fan electrical power that is electronically associated to the output value representing the mechanical clamping pressure between the heat sink and the system board assembly; and
cooling the heat sink and the system board assembly by operating a cooling fan at the fan electrical power.

2. The method of claim 1, further comprising identifying a processor power state based on the output value representing the mechanical clamping pressure.

3. The method of claim 1, further comprising reducing a speed associated with the cooling fan in response to the output value representing the mechanical clamping pressure.

4. The method of claim 1, further comprising increasing a speed associated with the cooling fan in response to the output value representing the mechanical clamping pressure.

5. The method of claim 1, further comprising reducing a performance associated with the system board assembly in response to the output value representing the mechanical clamping pressure.

6. The method of claim 1, further comprising increasing a performance associated with the system board assembly in response to the output value representing the mechanical clamping pressure.

7. The method of claim 1, further comprising generating an error in response to the output value representing the mechanical clamping pressure between the heat sink and the system board assembly.

8. A system comprising:
a processor; and
a memory device storing instructions that when executed by the processor perform operations, the operations including:
receiving an output value representing a mechanical clamping pressure between a heat sink and a system board assembly;
identifying a fan electrical power by querying an electronic database for the output value representing the mechanical clamping pressure, the electronic database electronically associating output values to electrical powers including the fan electrical power that is electronically associated to the output value representing the mechanical clamping pressure; and
cooling the heat sink and the system board assembly by operating a cooling fan at the fan electrical power.

9. The system of claim 8, wherein the operations further include identifying a processor power state based on the output value representing the mechanical clamping pressure.

10. The system of claim 8, wherein the operations further include reducing a speed associated with the cooling fan in response to the output value representing the mechanical clamping pressure.

11. The system of claim 8, wherein the operations further include increasing a speed associated with the cooling fan in response to the output value representing the mechanical clamping pressure.

12. The system of claim 8, wherein the operations further include reducing a performance associated with the system board assembly in response to the output value representing the mechanical clamping pressure.

13. The system of claim 8, wherein the operations further include increasing a performance associated with the system board assembly in response to the output value representing the mechanical clamping pressure.

14. The system of claim 8, wherein the operations further include generating an error in response to the output value representing the mechanical clamping pressure between the heat sink and the system board assembly.

15. A non-transitory memory device storing instructions that when executed perform operations, the operations comprising:
   receiving an output value representing a mechanical clamping pressure between a heat sink and a system board assembly;
   identifying a fan electrical power by querying an electronic database for the output value, the electronic database electronically associating output values to electrical powers including the fan electrical power that is electronically associated to the output value; and
   cooling the heat sink and the system board assembly by operating a cooling fan at the fan electrical power.

16. The non-transitory memory device of claim 15, wherein the operations further include identifying a processor power state based on the output value representing the mechanical clamping pressure.

17. The non-transitory memory device of claim 15, wherein the operations further include reducing a speed associated with the cooling fan in response to the output value representing the mechanical clamping pressure.

18. The non-transitory memory device of claim 15, wherein the operations further include increasing a speed associated with the cooling fan in response to the output value representing the mechanical clamping pressure.

19. The non-transitory memory device of claim 18, wherein the operations further include reducing a performance associated with the system board assembly in response to the output value representing the mechanical clamping pressure.

20. The non-transitory memory device of claim 15, wherein the operations further include increasing a performance associated with the system board assembly in response to the output value representing the mechanical clamping pressure.

* * * * *